United States Patent
Mortensen

(10) Patent No.: US 9,197,967 B2
(45) Date of Patent: Nov. 24, 2015

(54) MICROPHONE AND METHOD TO POSITION A MEMBRANE BETWEEN TWO BACKPLATES

(75) Inventor: Dennis Mortensen, Frederiksberg C (DK)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 14/002,500

(22) PCT Filed: Mar. 4, 2011

(86) PCT No.: PCT/EP2011/053329
§ 371 (c)(1),
(2), (4) Date: Oct. 23, 2013

(87) PCT Pub. No.: WO2012/119637
PCT Pub. Date: Sep. 13, 2012

(65) Prior Publication Data
US 2014/0037121 A1    Feb. 6, 2014

(51) Int. Cl.
*H04R 9/08* (2006.01)
*H04R 19/04* (2006.01)
*H04R 19/00* (2006.01)
*B81C 3/00* (2006.01)

(52) U.S. Cl.
CPC ............... *H04R 19/04* (2013.01); *B81C 3/004* (2013.01); *H04R 19/005* (2013.01); *B81B 2201/0257* (2013.01); *B81C 2203/051* (2013.01)

(58) Field of Classification Search
CPC ....... H04R 19/00; H04R 19/04; H04R 25/407
USPC ......... 381/355–358, 369, 170, 171, 173, 174, 381/175
See application file for complete search history.

(56) References Cited

U.S. PATENT DOCUMENTS

| | | | |
|---|---|---|---|
| 8,290,171 B1* | 10/2012 | Helfrich ................ | H04R 5/04 381/111 |
| 2003/0103639 A1* | 6/2003 | Rittersma ............ | H04R 19/016 381/355 |
| 2006/0140431 A1* | 6/2006 | Zurek .................... | 381/355 |
| 2006/0147061 A1* | 7/2006 | Niwa ...................... | H03F 1/30 381/113 |
| 2007/0201710 A1 | 8/2007 | Suzuki et al. | |

(Continued)

FOREIGN PATENT DOCUMENTS

CN   201515491 U   6/2010
CN   101788569 A   7/2010

(Continued)

OTHER PUBLICATIONS

Martin, D., et al., "A Micromachined Dual-Backplate Capacitive Microphone for Aeroacoustic Measurements," Journal of Microelectromechanical Systems, vol. 16, No. 6, Dec. 2007, pp. 1289-1302.

*Primary Examiner* — Brian Ensey
*Assistant Examiner* — Julie X Dang
(74) *Attorney, Agent, or Firm* — Slater & Matsil, L.L.P.

(57) ABSTRACT

A microphone includes two backplates. A membrane is located between the two backplates. A voltage source applies a first bias voltage to the membrane and the first backplate and applies a second bias voltage to the membrane and the second backplate. A control unit adjusts the first and the second bias voltage. A method to center the membrane in a final electro-mechanic equilibrium position between the two backplates in a microphone is also disclosed.

12 Claims, 1 Drawing Sheet

(56) References Cited

U.S. PATENT DOCUMENTS

| | | | |
|---|---|---|---|
| 2007/0228869 A1* | 10/2007 | Aksyuk | G02B 7/1827 310/309 |
| 2009/0169033 A1* | 7/2009 | Wu | H04R 31/006 381/113 |
| 2010/0123366 A1 | 5/2010 | Chang | |
| 2010/0137719 A1 | 6/2010 | Ikeda et al. | |
| 2010/0268081 A1 | 10/2010 | Asafusa et al. | |
| 2011/0123043 A1* | 5/2011 | Felberer et al. | 381/94.2 |
| 2011/0193502 A1* | 8/2011 | Aksyuk et al. | 318/116 |
| 2012/0217171 A1* | 8/2012 | Wurzinger | G01C 19/5776 205/775 |

FOREIGN PATENT DOCUMENTS

| | | |
|---|---|---|
| EP | 2214421 A1 * | 8/2010 |
| EP | 2269746 A1 * | 1/2011 |
| JP | 58048600 A | 3/1983 |
| JP | 10234098 A | 9/1998 |
| JP | 2005323193 A | 11/2005 |
| JP | 2008147863 A | 6/2008 |
| JP | 2010154734 A | 7/2010 |
| JP | 2011030047 A | 2/2011 |
| WO | 2008136198 A1 | 11/2008 |
| WO | 2009075280 A1 | 6/2009 |
| WO | WO 2009129351 A2 * | 10/2009 |
| WO | 2011025939 A1 | 3/2011 |

* cited by examiner

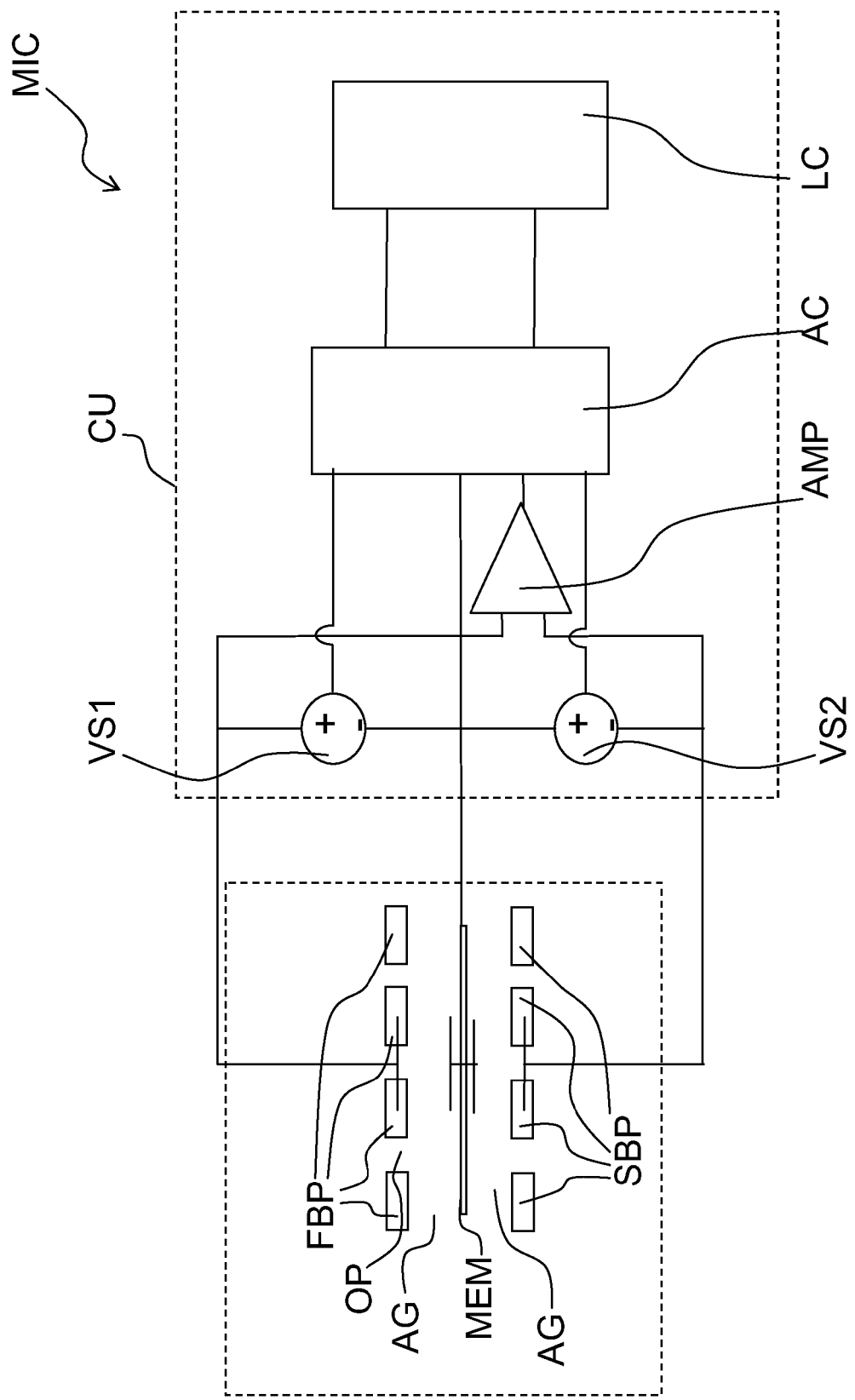

MICROPHONE AND METHOD TO POSITION A MEMBRANE BETWEEN TWO BACKPLATES

This patent application is a national phase filing under section 371 of PCT/EP2011/053329, filed Mar. 4, 2011, which is incorporated herein by reference in its entirety.

TECHNICAL FIELD

The present invention concerns a microphone. In particular embodiments, the present invention concerns a dual backplate microphone comprising two backplates and a membrane located between the two backplates. In further embodiments, the present invention provides a method to position a membrane between two backplates of a dual backplate microphone.

BACKGROUND

Compared to a regular microphone comprising a membrane and one backplate, a dual backplate microphone provides a performance increase on the same chip area. In a dual backplate microphone, a first capacitance between the membrane and the first backplate is measured and simultaneously a second capacitance between the membrane and the second backplate is measured. Compared to a single backplate microphone, the performance is increased by taking the difference between the measured capacitances. However, the performance of the microphone is highly dependent on the accuracy of the position of the membrane between the two backplates.

Methods are known to position the membrane between the two backplates precisely during manufacturing of a microphone. These methods optimize the design and the processing of the microphone. However, the precision that can be achieved during manufacturing is not accurate enough to fulfill the increasing demands concerning the specifications of microphones. Accordingly, there is a need to increase the precision of the positioning of the membrane between the two backplates in a dual backplate microphone.

SUMMARY OF THE INVENTION

Embodiments of the present invention provide a microphone that allows positioning the membrane between the two backplates more precisely. Further embodiments of the present invention provide a method to position a membrane precisely between two backplates in a microphone.

A microphone according to the present invention comprises two backplates. A membrane is located between the two backplates. A voltage source applies a first bias voltage to the membrane and the first backplate and applies a second bias voltage to the membrane and the second backplate. A control unit adjusts the first and the second bias voltage.

In an alternative design, the microphone further comprises a second voltage source. Here, the first voltage source applies only a first bias voltage to the membrane and the first backplate, while the second voltage source applies a second bias voltage to the membrane and the second backplate.

The control unit comprises analog and/or logic circuitry components and can be located on the microphone-chip, on a dedicated ASIC-chip (Application Specific Integrated Circuit), in an external setup or in a combination with on-chip analog circuitry and external logic.

Air-gaps separate the membrane and each of the backplates. Accordingly, if a bias voltage is applied between the membrane and one of the backplates a capacitor formed by the membrane and the respective backplate is charged. Accordingly, electrostatic force acts between the membrane and the backplate. Thus the air-gap between the membrane and the backplate is reduced as the membrane moves towards the backplate until equilibrium has been reached between the restoring membrane force and the electrostatic force.

In an ideal microphone, the membrane and the backplates have a precisely known shapes and mechanical properties. Therefore, in this case the position of the membrane between the two backplates can be calculated exactly. However, in a real microphone, due to limited manufacturing precision, the geometries and mechanical properties of the backplates and the membrane can vary and become asymmetric. Thus, the distances between the membrane and the two backplates can deviate from the calculated ideal distances for an ideal microphone when bias voltages are applied. According to the present invention, the control unit can adjust the first and the second bias voltage. Adjusting these voltages allows the correction of the positioning of the membrane.

In contrast to prior art microphones, the present invention allows to readjust the position of the membrane after the manufacturing of the microphone has been completed. Accordingly, the precision of the positioning can be highly increased.

In one embodiment, the control unit can comprise at least one adjustable voltage pump. Preferably, the control unit comprises two adjustable voltage pumps wherein each of the adjustable voltage pumps can adjust one of the first or second bias voltages. A voltage pump is a DC to DC converter that uses capacitors as energy storage elements to create either a higher or lower voltage power source. Voltage pumps are sometimes referred to as charge pumps as well.

In one embodiment, the microphone comprises a way to measure the capacitance between the membrane and the first backplate and a further capacitance between the membrane and the second backplate.

In one embodiment, the microphone comprises a way to measure the collapse voltage between the membrane and the first backplate and further the collapse voltage between the membrane and the second backplate. The collapse voltage is the voltage that needs to be applied between the membrane and a respective backplate so that the membrane and the respective backplate are in contact with each other.

In one embodiment, the microphone is a MEMS microphone wherein the voltage source and the control unit are integrated in an application-specific integrated circuit (ASIC).

In one embodiment, the microphone can be realized on a single chip wherein the control unit, the voltage source, the two backplates and the membrane are realized on the same chip.

In an alternate embodiment, the control unit is realized on a separate dedicated chip. The most likely positioning of the control unit is on a dedicated ASIC-chip. The backplates and the membrane are formed on a MIC-chip. The MIC- and the ASIC-chip are then electrically connected through a substrate-chip. This 3-chip system is called a CSP (Chip scale package).

In another alternative embodiment, the control unit is split. Part of the control unit can be realized on an external testing unit that is connected to the microphone only during testing. The other part of the control unit can be realized either on the MIC-chip or on a dedicated ASIC-chip.

The present invention further provides a method to position a membrane between two backplates. This method comprises the steps of determining the initial electro-mechanic equilibrium position of the membrane between the first and the second backplate after the manufacturing of the microphone, calculating an optimal value for the first and second bias voltage based to move the membrane to a final electro-mechanic equilibrium position between the first and second backplate, and adjusting the first and second bias voltage.

The initial electro-mechanic equilibrium position of the membrane between the first and the second backplate is the position that the membrane is in after the manufacturing is completed and the same bias voltage is applied between the membrane and the first backplate and between the membrane and the second backplate.

The final electro-mechanic equilibrium position of the membrane between the first and the second backplate is the position that the membrane is in after the two bias voltages have been adapted. In one embodiment, the membrane is centered in the middle between the two backplates in its final electro-mechanic equilibrium position.

The inventive method allows adjusting the two bias voltages so that the membrane is moved from its initial electro-mechanic equilibrium position to a final electro-mechanic equilibrium position which is typically centered in the middle between the two backplates.

This method can be applied after completion of the microphone manufacturing. In particular, the method can be applied in a final testing phase before delivering the microphone to a customer, but could as well be performed once or multiple times when the microphone is build-in to a customer product. The method allows determining the initial membrane position between the two backplates after manufacturing and/or customer build-in and further to correct this initial position.

The first and the second bias voltage can be adjusted by setting the output of the adjustable voltage pump to a certain value.

In one embodiment, the first and the second bias voltage are chosen so that the membrane is centered in a final electro-mechanic equilibrium position between the first and the second backplate. Corresponding to the final electro-mechanic equilibrium position, different values for the two bias voltages can be chosen.

The method to position the membrane comprises the step of determining the initial electro-mechanic equilibrium position of the membrane between the first and the second backplate after manufacturing. This step can be carried out in different ways.

One possibility is to set the first and second bias voltage to a start value, then to increase the first bias voltage until the membrane and the first backplate are in contact with each other and to determine the value of the first bias voltage at which the membrane and the first backplate are in contact with each other. This value is also referred to as collapse voltage. Accordingly, the collapse voltage that is determined in this step is the voltage that needs to be applied to the first backplate and to the membrane in order to cause physical contact between these two elements.

In the next step, the first bias voltage is reset to its start value, the second bias voltage is increased until the membrane and the second backplate are in contact with each other. The value of the second bias voltage at which the membrane and the second backplate are in contact with each other is determined and the initial electro-mechanic equilibrium position of the membrane between the first and second backplate can now be calculated based on the measured collapse voltages. This information can be fed into or distributed within the control unit and the control unit adjusts the bias voltages to center the membrane between the two backplates.

Alternatively, the initial electro-mechanic equilibrium position of the membrane between the first and the second backplate after manufacturing can be determined by measuring the capacitance at one or multiple voltages between the membrane and each of the two backplates. The measured capacitances are then compared to predefined center values, and the bias voltages are adjusted and the membrane is shifted closer to its final electro-mechanic equilibrium position between the first and second backplate.

This method can be repeated several times until the membrane is precisely centered at its final electro-mechanic equilibrium position between the two backplates. This feedback system also allows the bias voltages to be adjusted based on the measured capacitance.

By adjusting the position of the membrane between the two backplates the microphone becomes acoustically symmetric. This optimizes the maximum sound pressure level (MAX SPL) and minimizes the total harmonic distortion (THD). The MAX SPL describes how much acoustic pressure can be applied to the microphone until the membrane is pulled towards one of the backplates. Preferably, the MAX SPL should be as high as possible as MAX SPL describes the measurement range of the microphone. The THD describes how much the signal is distorted at a given sound pressure level. The THD is minimized by the present invention.

BRIEF DESCRIPTION OF THE DRAWING

The present invention will become fully understood from the detailed description given herein below and the accompanying schematic drawings. In the drawing:

The sole FIGURE shows a schematic drawing of a dual backplate MEMS microphone according to the present invention.

DETAILED DESCRIPTION OF ILLUSTRATIVE EMBODIMENTS

The FIGURE shows a dual backplate MEMS microphone MIC according to the present invention. The microphone MIC comprises a first backplate FBP and a second backplate SBP. Further, the microphone MIC comprises a membrane MEM that is located between the first and the second backplate FBP, SBP. There is an air-gap AG between the membrane MEM and each of the backplates FBP, SBP. The first and the second backplate FBP, SBP each comprise openings OP so that the air-gaps AG and the membrane MEM are in contact with the environment. If an acoustic signal applies a pressure to the microphone MIC, the acoustic signal can propagate through the openings OP of the backplates FBP, SBP and the membrane MEM is moved by the corresponding pressure variation.

Further, the microphone MIC comprises a control unit CU which comprises two voltage sources VS1, VS2. The control unit CU can be integrated on a single chip together with the membrane MEM and the backplates FBP, SBP, located on a dedicated chip, e.g., an ASIC-chip, being part of an external setup or distributed on both a chip comprising the membrane MEM and the backplates FBP, SBP, a dedicated chip and/or on an external setup.

In the embodiment as shown in FIG. 1, the control unit CU is realized on a dedicated ASIC-chip. The membrane MEM and the backplates FBP, SBP are realized on another chip. The two chips are electrically connected via a third chip, the substrate chip. The control unit CU comprises the two voltage sources VS1, VS2, an amplifier AMP, analog circuits AC and logic circuits LC.

The first voltage source VS1 applies a first bias voltage between the first backplate FBP and the membrane MEM. As the membrane MEM and the first backplate FBP are separated by an air-gap AG, a capacitance is created between membrane MEM and first backplate FBP. The first backplate FBP is on a first voltage level and the membrane MEM is on a different voltage level.

The second voltage source VS2 applies a bias voltage between the membrane MEM and the second backplate SBP. As the membrane MEM and the second backplate FBP are separated by an air-gap AG, a capacitance is created between membrane MEM and second backplate SBP. The second backplate SBP is on a second voltage level and the membrane MEM is on a different voltage level.

The control unit CU enables adjustment of the first and second bias voltage that is applied between the membrane MEM and each of the backplates FBP, SBP. For this purpose the control unit CU comprises two adjustable voltage pumps. The output of these voltage pumps can be adjusted so that the capacitance between the membrane MEM and each of the backplates FBP, SBP can be varied. The output levels of the voltage pumps are chosen so that the membrane MEM is centered in a final electro-mechanic equilibrium position between the two backplates FBP, SBP.

In an alternative design, the control unit CU comprises only one voltage source VS1. Here, the voltage source VS1 is connected to the membrane MEM, the first backplate FBP and the second backplate SBP. A first voltage level is applied to the membrane MEM, e.g., a voltage between 5V and 20V. Further, much lower voltages are applied to the first and the second backplate FBP, SBP, e.g., voltages between 0.01 and 2V.

Accordingly, a first capacitance is created between the membrane MEM and the first backplate FBP and a second capacitance is created between the membrane MEM and the second backplate SBP. Further, the control unit CU can vary the voltages that are applied to the membrane MEM and/or to the first and the second backplate FBP, SBP and therefore, the control unit CU can adjust the capacitances between the membrane MEM and the two backplates FBP, SBP.

I claim:

1. A dual-backplate microphone comprising:
   first and second backplates;
   a membrane located between the first and second backplates;
   a voltage source configured to apply a first bias voltage between the membrane and the first backplate and a second bias voltage between the membrane and the second backplate; and
   a control unit configured to adjust the first and the second bias voltage; and a measurement circuit configured to measure a collapse voltage between the membrane and the first backplate and a collapse voltage between the membrane and the second backplate.

2. The microphone according to claim 1, wherein the voltage source comprises a first voltage source configured to apply the first bias voltage to the membrane and the first backplate and a second voltage source configured to apply the second bias voltage to the membrane and the second backplate.

3. The microphone according to claim 1, wherein the control unit comprises an adjustable voltage pump.

4. The microphone according to claim 1, further comprising a measurement circuit configured to measure a capacitance between the membrane and the first backplate and a further capacitance between the membrane and the second backplate.

5. The microphone according to claim 1, wherein the microphone is a MEMS microphone.

6. The microphone according to claim 1,
   wherein the membrane and the first and second backplates are realized on a first chip;
   wherein the control unit and the voltage source are integrated in an application-specific integrated circuit chip; and
   wherein the first chip and the application-specific integrated circuit chip are electrically connected through a substrate-chip.

7. The microphone according to claim 1, wherein the membrane, the first and second backplates, the control unit and the voltage source are integrated on a single chip.

8. The microphone according to claim 1, wherein parts of the control unit are integrated on an external testing unit.

9. A method to position a membrane between first and second backplates in a microphone, the method comprising:
   determining an initial electro-mechanic equilibrium position of the membrane between the first and the second backplates after the manufacture of the microphone;
   calculating an optimal value for a first and a second bias voltage to move the membrane to a final electro-mechanic equilibrium position between the first and second backplates, the first bias voltage applied between the membrane and the first backplate and the second bias voltage applied between the membrane and the second backplate, and wherein the optimal value for the first and the second bias voltage is chosen so that the membrane is centered in a final electro-mechanic equilibrium position in the middle between the first backplate and the second backplate; and adjusting the first bias voltage and second bias voltage.

10. The method according to claim 9, wherein the first bias voltage and the second bias voltage are adjusted by setting an output of an adjustable voltage pump to a certain value.

11. The method according to claim 9, wherein the initial electro-mechanic equilibrium position of the membrane between the first and the second backplates is determined by
   setting the first and second bias voltage to a start value;
   increasing the first bias voltage until the membrane and the first backplate are in contact with each other;
   determining a value of a first collapse voltage at which the membrane and the first backplate are in contact with each other;
   resetting the first bias voltage to the start value;
   increasing the second bias voltage until the membrane and the second backplate are in contact with each other;
   determining a value of a second collapse voltage at which the membrane and the second backplate are in contact with each other; and
   calculating the initial electro-mechanic equilibrium position of the membrane between the first and second backplates based on the determined voltages.

12. The method according to claim 9, wherein the initial electro-mechanic equilibrium position of the membrane between the first and the second backplates is determined by
   measuring a capacitance between the membrane and the first backplate and between the membrane and the second backplate; and
   calculating the initial electro-mechanic equilibrium position of the membrane between the first and second backplates based on the measured capacitance.

* * * * *